(12) United States Patent
Lin et al.

(10) Patent No.: US 9,666,480 B2
(45) Date of Patent: May 30, 2017

(54) ARRAY SUBSTRATE, METHOD FOR MANUFACTURING THE SAME AND METHOD FOR MEASURING THE SAME, DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zijin Lin, Beijing (CN); Haisheng Zhao, Beijing (CN); Tielin Zhang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 172 days.

(21) Appl. No.: 14/492,518

(22) Filed: Sep. 22, 2014

(65) Prior Publication Data

US 2015/0370110 A1 Dec. 24, 2015

(30) Foreign Application Priority Data

Jun. 19, 2014 (CN) .......................... 2014 1 0277039

(51) Int. Cl.
*G01R 31/02* (2006.01)
*H01L 21/768* (2006.01)
(Continued)

(52) U.S. Cl.
CPC ...... *H01L 21/76877* (2013.01); *G02F 1/1362* (2013.01); *H01L 27/124* (2013.01);
(Continued)

(58) Field of Classification Search
CPC G01R 31/3025; G01R 19/252; G01R 31/308; H01J 9/24; H01L 2924/0002; G01N 2201/062
(Continued)

(56) References Cited

U.S. PATENT DOCUMENTS

2011/0157039 A1* 6/2011 Shin .................... G02F 1/13338
345/173

FOREIGN PATENT DOCUMENTS

CN 1893091 A 1/2007
CN 101256326 A 9/2008
(Continued)

OTHER PUBLICATIONS

First Office Action regarding Chinese application No. 201410277039.8, dated Apr. 25, 2016. Translation provided by Dragon Intellectual Property Law Firm.

*Primary Examiner* — Melissa Koval
*Assistant Examiner* — Trung Nguyen
(74) *Attorney, Agent, or Firm* — Harness, Dickey & Pierce, P.L.C.

(57) ABSTRACT

An array substrate comprising an electrical connection block exposed to its surface. By manufacturing a passivation layer via hole in a passivation layer, a drain electrode or a pixel electrode of a thin-film transistor is exposed, so that the electrical connection block fills the passivation layer via hole and is provided in contact with the drain electrode or the pixel electrode. Thereby, when the electrical characteristic value of a TFT is measured, the pixel probe of a measuring apparatus may be electrically connected with the drain electrode or the pixel electrode by directly contacting the electrical connection block, so that the measuring of the electrical characteristics of the TFT may be realized.

7 Claims, 4 Drawing Sheets

(51) Int. Cl.
  *H01L 27/12* (2006.01)
  *G02F 1/1362* (2006.01)
  *G09G 3/00* (2006.01)

(52) U.S. Cl.
  CPC .... *H01L 27/1259* (2013.01); *G02F 1/136227* (2013.01); *G02F 2001/136254* (2013.01); *G09G 3/006* (2013.01)

(58) Field of Classification Search
  USPC ... 324/762.01, 500, 600, 760.01–762.1, 727, 324/522, 525, 713, 750.01, 750.24; 257/48, E21.521
  See application file for complete search history.

(56) References Cited

FOREIGN PATENT DOCUMENTS

| | | |
|---|---|---|
| CN | 102944959 A | 2/2013 |
| CN | 103217840 A | 7/2013 |
| KR | 100916607 B1 | 9/2009 |

\* cited by examiner

ARRAY SUBSTRATE, METHOD FOR MANUFACTURING THE SAME AND METHOD FOR MEASURING THE SAME, DISPLAY DEVICE

CROSS REFERENCE OF THE RELATED APPLICATION

The present application claims priority to the Chinese application No. 201410277039.8 filed on Jun. 19, 2014, entitled with "Array Substrate, Method for Manufacturing the Same and Method for Measuring the Same, Display Device", the entire contents of which are incorporated herein by reference.

FIELD OF THE INVENTION

The present invention relates to the field of liquid crystal display technologies, and in particular, to an array substrate and a method for manufacturing the same and method for measuring the same, as well as a display device.

DESCRIPTION OF THE PRIOR ART

A thin-film transistor liquid crystal display (TFT-LCD) has the features of small volume, low power consumption, no radiation and relatively low manufacturing cost, etc., thus it stands in a leading position in the current flat-panel display market. TFT-LCD array substrate is one of the important components of a TFT-LCD. Crossed gate lines and data lines are formed on the array substrate to define a plurality of pixel units, and each pixel unit includes a thin-film transistor (TFT), a pixel electrode and a common electrode. The drain electrode and the pixel electrode of the TFT are electrically connected, the source electrode and the data line are electrically connected, and the gate electrode and the gate line are electrically connected. The pixel voltage transmitted on the data line is output to the pixel electrode via the thin-film transistor, and the pixel electrode cooperates with the common electrode to form a driving electric field that drives a liquid crystal molecule to deflect, so that the display of a certain gray scale may be realized.

It can be seen that the electrical characteristics of the TFT directly influence the display quality of a TFT-LCD. Thus, during practical production, it needs to measure the electrical characteristics of the TFT. Wherein, the electrical characteristics of the TFT mainly include $I_{on}$ (the working current of a TFT), $I_{off}$ (reverse cutoff current), $V_{th}$ (cutin voltage) and Mobility, and each parameter is very important. At present, during measuring, an apparatus for measuring the electrical characteristics of a TFT needs to contact the corresponding probe with the wiring so as to measure the electrical characteristic value, for example, a gate line (Gate) probe is contacted with a gate line, a data probe is contacted with a data line, and a pixel probe is contacted with a drain electrode or a pixel electrode. By loading a 0-20V electrical signal via a Gate probe and loading a 15V electrical signal via a Data probe, the electrical characteristic value of the TFT may be obtained via the signal output by the Pixel probe.

When no common electrode is formed on the array substrate, the pixel electrode is located on the uppermost layer of the array substrate, and the Pixel probe for measuring the electrical characteristics of the TFT may directly contact the pixel electrode to measure the electrical characteristic value of the TFT. However, when a common electrode is formed on the array substrate, the common electrode is usually located on the uppermost layer of the array substrate, and the pixel electrode is located under the common electrode. As a result, the Pixel probe of a measuring apparatus cannot directly contact the pixel electrode, thus the electrical characteristics of a practical TFT cannot be measured.

SUMMARY OF THE INVENTION

The present invention provides an array substrate, a method for manufacturing the same and a method for measuring the same, as well as a display device, thereby solving the problem that, when a common electrode is formed on the array substrate, the Pixel probe of an apparatus for measuring the electrical characteristics of a TFT cannot directly contact the pixel electrode and thus cannot measure the electrical characteristic value of the TFT.

In order to solve the above technical problem, the invention provides the following technical solutions.

According to an embodiment of the invention, the invention provides an array substrate which comprises a plurality of pixel units, and each pixel unit comprises a thin-film transistor, a pixel electrode and a common electrode, wherein a passivation layer covers on the pixel electrode and the thin-film transistor, the common electrode is located on the passivation layer and corresponds to the location of the pixel electrode, and a drain electrode of the thin-film transistor is electrically connected with the pixel electrode, wherein, a passivation layer via hole is formed in the passivation layer;

each pixel unit further comprises an electrical connection block that fills the passivation layer via hole; and one end of the electrical connection block is provided in contact with the pixel electrode or the drain electrode via the passivation layer via hole, and the other end is exposed to the surface of the array substrate.

In another embodiment of the invention, in the above array substrate, the electrical connection block and the common electrode are formed of the same transparent conductive layer at the same time via a one-time patterning process, and the common electrode is provided on the uppermost layer of the array substrate.

In another embodiment of the invention, in the above array substrate, the electrical connection block penetrates through the passivation layer via hole, the contact area between one end of the electrical connection block and the pixel electrode or the drain electrode is smaller than the sectional area of the other end that is exposed to the surface of the array substrate, and the other end that is exposed to the surface of the array substrate covers the surface of the passivation layer.

In another embodiment of the invention, in the above array substrate, the drain electrode of the thin-film transistor is provided on the pixel electrode and directly lapped on the pixel electrode; and one end of the electrical connection block is provided in contact with the drain electrode of the thin-film transistor via the passivation layer via hole.

In another embodiment of the invention, in the above array substrate, the pixel electrode is provided on the drain electrode of the thin-film transistor and directly lapped on the drain electrode of the thin-film transistor; and one end of the electrical connection block is provided in contact with the pixel electrode via the passivation layer via hole.

According to further embodiment of the invention, the invention provides a display device, which comprises the above array substrate.

According to still further embodiment of the invention, the invention provides a method for manufacturing an array substrate, which comprises forming a plurality of pixel units, wherein, the step of forming each pixel unit comprises:

forming the patterns of a thin-film transistor and a pixel electrode;

forming a passivation layer on the pixel electrode and the thin-film transistor;

forming the pattern of a common electrode on the passivation layer, wherein the common electrode corresponds to the location of the pixel electrode, and a drain electrode of the thin-film transistor is electrically connected with the pixel electrode;

performing a patterning process on the passivation layer to form a passivation layer via hole; and forming an electrical connection block that fills the passivation layer via hole, wherein one end of the electrical connection block is provide in contact with the pixel electrode or the drain electrode, and the other end is exposed to the surface of the array substrate.

In another embodiment of the invention, in the above manufacturing method, the step of forming the common electrode and the electrical connection block comprises:

forming a transparent conductive layer on the passivation layer; and performing a patterning process on the transparent conductive layer to form the patterns of the common electrode and the electrical connection block.

In another embodiment of the invention, in the above manufacturing method, the electrical connection block penetrates through the passivation layer via hole, the contact area between one end of the electrical connection block and the pixel electrode or the drain electrode is smaller than the sectional area of the other end that is exposed to the surface of the array substrate, and the other end that is exposed to the surface of the array substrate covers the surface of the passivation layer.

According to still further embodiment of the invention, the invention provides a method for measuring the electrical characteristics of the above array substrate, which comprises:

contacting a gate line probe with the gate line of the array substrate;

contacting a data probe with the data line of the array substrate; and contacting a pixel probe with the electrical connection block, loading a preset voltage to the gate line probe and the data line probe, and obtaining the electrical characteristic value of the thin-film transistor via a signal output by the pixel probe.

The above technical solutions of the invention have the following beneficial effects:

In the above technical solutions, by manufacturing a passivation layer via hole in the passivation layer, a drain electrode or a pixel electrode of a thin-film transistor is exposed, so that the electrical connection block fills the passivation layer via hole and is provided in contact with the drain electrode or the pixel electrode. Thereby, when the electrical characteristic value of a TFT is measured, the pixel probe of a measuring apparatus may be electrically connected with the drain electrode or the pixel electrode by directly contacting the electrical connection block, so that the measuring of the electrical characteristics of the TFT may be realized.

BRIEF DESCRIPTION OF THE DRAWINGS

In order to more clearly illustrate the technical solutions of the embodiments of the invention or the prior art, the drawings required in the description of the embodiments or the prior art will be briefly introduced below. Apparently, the drawings in the description below only show some embodiments of the invention, and other drawings may also be obtained by one of ordinary skills in the art based on these drawings without creative work.

DETAILED DESCRIPTION OF THE PREFERRED EMBODIMENTS

Figure 1:
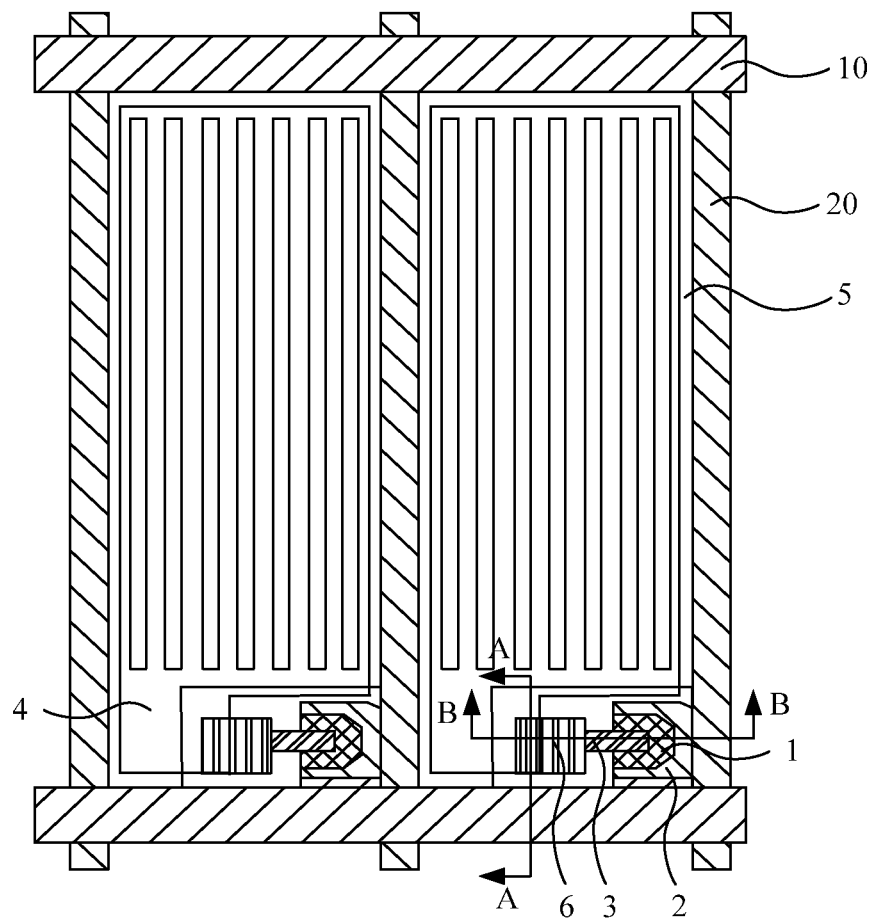
FIG. 1 shows a structural representation of an array substrate according to one embodiment of the invention.

As shown in FIG. 1, an array substrate of a TFT-LCD includes a gate line 10 and a data line 20 that are crossed, and the gate line 10 and the data line 20 defines a plurality of pixel units. Each pixel unit includes a thin-film transistor and a pixel electrode 4, and a gate electrode 1 of the thin-film transistor is electrically connected with the gate line 10, a source electrode 2 is electrically connected with the data line 20, and a drain electrode 3 is electrically connected with the pixel electrode 4. The TFT-LCD further includes a common electrode 5, which is used for cooperating with the pixel electrode 4 to generate an electric field that drives the liquid crystal molecule to rotate. The common electrode 5 may be formed on the array substrate, or it may be formed on a color filter substrate of the TFT-LCD.

For a TFT-LCD, the electrical characteristics of the TFT directly influence the display quality of the product. Thus, during practical production, it is one of the most important manufacturing sectors to measure the electrical characteristics of the TFT. The electrical characteristics of the TFT mainly include $I_{on}$ (the working current of a TFT), $I_{off}$ (reverse cutoff current), $V_{th}$ (cutin voltage) and Mobility. At present, during measuring, an apparatus for measuring the electrical characteristics of a TFT needs to contact the corresponding probe with the wiring so as to measure the electrical characteristic value, for example, a gate line probe is contacted with a gate line, a data probe is contacted with a data line, and a pixel probe is contacted with a drain electrode or a pixel electrode.

When the common electrode 5 is formed on the color filter substrate, the pixel electrode 4 is located on the uppermost layer of the array substrate, and the pixel probe for measuring the electrical characteristics of the TFT may directly contact the pixel electrode to measure the electrical characteristic value of the TFT. However, when the common electrode 5 is formed on the array substrate and located on the uppermost layer of the array substrate and the pixel electrode 4 is located under the common electrode 5, the pixel probe of a measuring apparatus will be unable to directly contact the pixel electrode 4, thus the electrical characteristics of a practical TFT cannot be measured.

As directed to the above technical problem, the invention provides a thin-film transistor array substrate and a method for manufacturing the same, thereby the measuring of the electrical characteristics of a TFT may be realized when a common electrode is located on an array substrate and above a pixel electrode, i.e., on the uppermost layer of the array substrate.

The specific implementation mode of the invention will be further described in detail below in conjunction with the drawings and embodiments. The following embodiments are used for illustrating the invention, rather than limiting the scope of the invention.

According to one embodiment of the invention, the invention provides an array substrate, which includes a plurality of pixel units, and each pixel unit includes a thin-film transistor, a pixel electrode and a common electrode, wherein a passivation layer covers on the pixel electrode and the thin-film transistor, the common electrode is located on the passivation layer and corresponds to the location of the pixel electrode, and a drain electrode of the thin-film transistor is electrically connected with the pixel electrode, wherein a passivation layer via hole is further formed in the passivation layer to expose the drain electrode of the thin-film transistor or pixel electrode, and each pixel unit is configured to comprises an electrical connection block that fills the passivation layer via hole, so that one end of the electrical connection block is provided in contact with the pixel electrode or the drain electrode via the passivation layer via hole, and the other end is exposed to the surface of the array substrate.

In the above technical solution, because one end of the electrical connection block is exposed to the surface of the array substrate, when the electrical characteristics of the TFT are measured, the pixel probe of a measuring apparatus may directly contact this end of the electrical connection block, and the electrical connection block electrically contacts the pixel electrode or the drain electrode, thereby the electrical connection between the pixel probe and the pixel electrode or the drain electrode may be realized, and the electrical characteristic value of the TFT may be obtained via the signal output by the probe.

According to further embodiment of the invention, the invention provides a method for manufacturing the above thin-film transistor array substrate which includes forming a plurality of pixel units.

Figure 4:
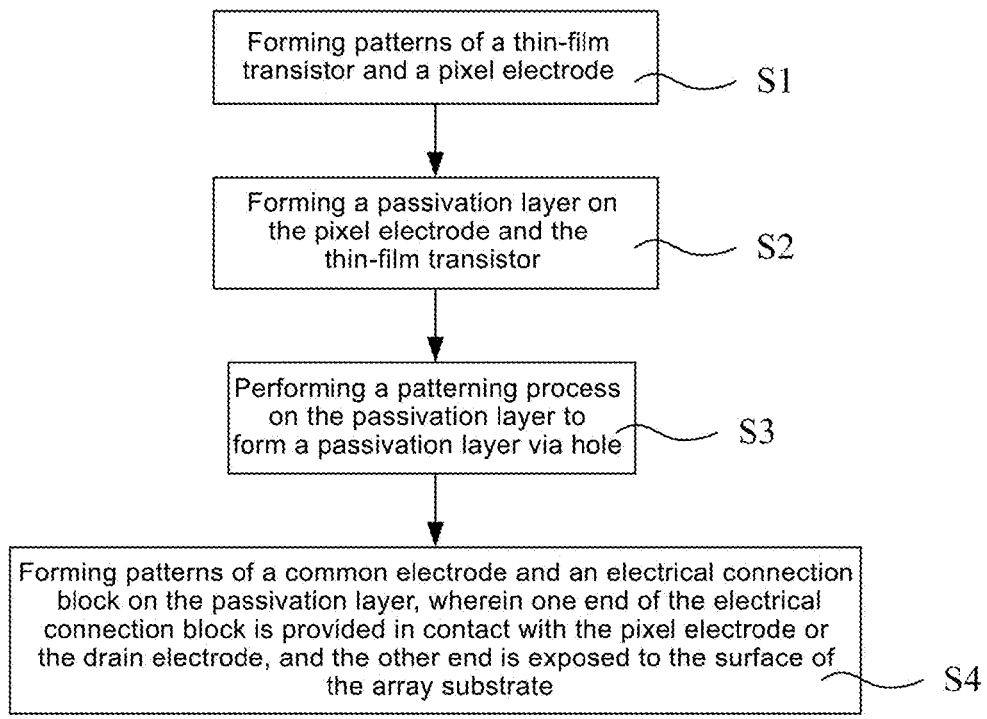
FIG. 4 is a schematic flow chart showing a manufacturing process of an array substrate according to one embodiment of the invention; and FIG. 5

As shown in FIG. 4, the step of forming each pixel unit comprises:

Step S1: forming the patterns of a thin-film transistor and a pixel electrode;

Step S2: forming a passivation layer on the pixel electrode and the thin-film transistor;

Step S3: performing a patterning process on the passivation layer to form a passivation layer via hole; and Step S4: forming the patterns of a common electrode and an electrical connection block that fills the passivation layer via hole on the passivation layer, wherein one end of the electrical connection block is provided in contact with the pixel electrode or the drain electrode via the passivation layer via hole, and the other end is exposed to the surface of the array substrate; and the common electrode corresponds to the location of the pixel electrode, and a drain electrode of the thin-film transistor is electrically connected with the pixel electrode.

In an embodiment of the invention, the electrical connection block and the common electrode are formed of the same transparent conductive layer at the same time via a one-time patterning process, and the common electrode is provided on the uppermost layer of the array substrate. Specifically, a transparent conducting film may be formed on the passivation layer, and then a patterning process is performed on the transparent conducting film to form the electrical connection block and the common electrode at the same time. That is, the transparent conducting film fills the passivation layer via hole at the location of the passivation layer via hole so as to form the above electrical connection block, without the need to additionally form a filling material as the electrical connection block. Since the layer on which the common electrode and the electrical connection block exist is located on the uppermost layer of the array substrate, the electrical connection block will be exposed to the surface of the array substrate. Thus, a pixel probe for measuring may directly contact the connection block to test the electrical characteristics of the array substrate.

In an embodiment of the invention, the step S4 includes:

coating a photoresist on the transparent conductive layer;

exposing and developing the photoresist to form a photoresist reserved region and a photoresist removed region, wherein, the photoresist reserved region at least corresponds to the region in which the common electrode and the electrical connection block exist, and the photoresist removed region corresponds to other regions;

removing the transparent conductive layer on the photoresist removed region via a wet etching process to form a pattern that includes a common electrode and an electrical connection block; and peeling off the remaining photoresist to form a common electrode and an electrical connection block.

Further, the electrical connection block penetrates through the passivation layer via hole, and the contact area between one end of the electrical connection block and the pixel electrode or the drain electrode is smaller than the sectional area of the other end that is exposed to the surface of the array substrate, and the other end that is exposed to the surface of the array substrate covers the surface of the passivation layer. Such a configuring mode is convenient for contacting a pixel probe for test with the electrical connection block and ensuring a good electrical contact therebetween, thereby the electrical characteristics of the array substrate may be tested more conveniently.

In the technical solution of the invention, by manufacturing a passivation layer via hole in a passivation layer, a drain electrode or a pixel electrode of a thin-film transistor is exposed, so that the electrical connection block fills the passivation layer via hole and is provided in contact with the drain electrode or the pixel electrode. Thereby, when the electrical characteristic value of a TFT is measured, the pixel probe of a measuring apparatus may be electrically connected with the drain electrode or the pixel electrode by directly contacting the electrical connection block, thereby the measuring of the electrical characteristic value of the TFT may be realized.

Generally, when the common electrode is formed on the array substrate, the drain electrode of the thin-film transistor is electrically connected with the pixel electrode in a direct lapping mode. It should be noted that the lapping concerned in the invention refers to that: a first pattern is located on a second pattern, and the two patterns are formed in contact with each other and have an overlapped region.

When the drain electrode of the thin-film transistor is formed on the pixel electrode and directly laps on the pixel electrode, one end of the electrical connection block is provided in contact with the drain electrode of the thin-film transistor via the passivation layer via hole.

When the pixel electrode is provided on the drain electrode of the thin-film transistor and directly laps on the drain electrode of the thin-film transistor, one end of the electrical connection block is provided in contact with the pixel electrode via the passivation layer via hole.

Figure 2:
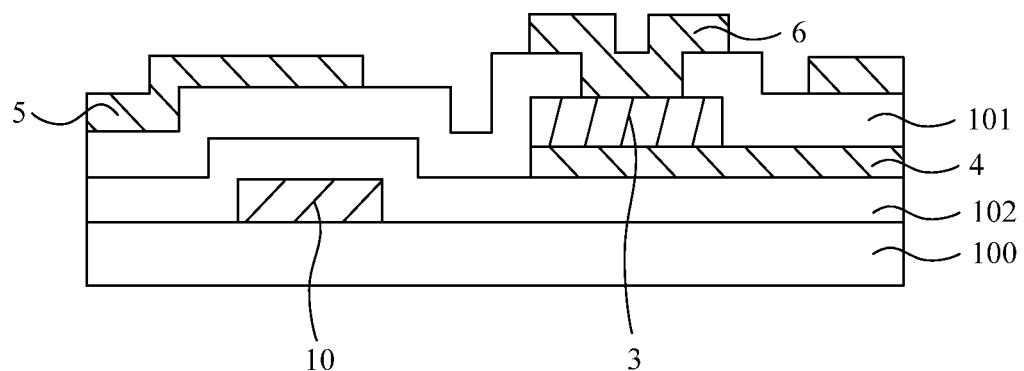
FIG. 2 shows a sectional view taken along direction A-A in FIG. 1.
Figure 3:
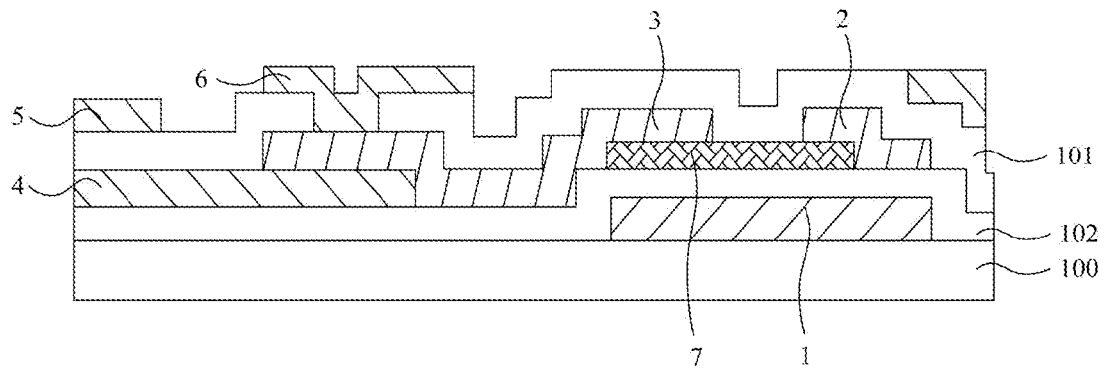
FIG. 3 shows a sectional view taken along direction B-B in FIG. 1.

As shown in FIG. 1-FIG. 3, in the embodiment of the invention, the array substrate includes:

a base substrate 100, which is a transparent substrate, usually a glass substrate, a quartz substrate or an organic resin substrate;

a gate electrode 1 and a gate line 10 formed on the base substrate 100, wherein the gate electrode 1 and the gate line 10 are electrically connected with each other;

a gate insulating layer 102 formed on the gate electrode 1 and the gate line 10;

an active pattern layer 7 formed on the gate insulating layer 102;

a pixel electrode 4 formed on the active layer pattern 7;

a data line 20, a source electrode 2 and a drain electrode 3 formed on the pixel electrode 4, wherein, the drain electrode 3 directly laps on the pixel electrode 4, and the source electrode 2 and the data line 20 are electrically connected with each other;

a passivation layer 101 formed on the data line 20, the source electrode 2 and the drain electrode 3, wherein a passivation layer via hole (not shown) is formed on the passivation layer 101 to expose the drain electrode 3; and a common electrode 5 and an electrical connection block 6 formed on the passivation layer 101, wherein the common electrode 5 is a slit electrode, which corresponds to the location of the pixel electrode 4; and the electrical connection block 6 fills the passivation layer via hole, one end thereof contacts the drain electrode 3 via the passivation layer via hole, and the other end covers the surface of the passivation layer 101.

Figure 5:
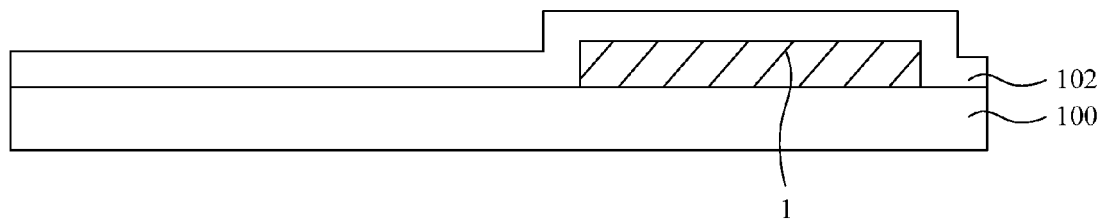

As shown in FIG. 3 and FIG. 5-FIG. 9, in one embodiment of the invention, a method for manufacturing an array substrate includes:

Step a: providing a base substrate 100, and forming a gate electrode 1 and a gate line (not shown in FIG. 5) on the base substrate 100 via a one-time patterning process, as shown in FIG. 5.

A base substrate 100 is provided, and a pattern consisted of a gate metal layer, which include a gate electrode 1 and a gate line connected with the gate electrode 1, is formed on the base substrate 100. Wherein, the base substrate 100 may be a glass substrate, a quartz substrate or an organic resin substrate.

Specifically, a gate metal layer with a thickness of 2500-16000 Å may be deposited on the base substrate 100 via sputtering or heat evaporation. The gate metal layer may be formed of a metal, for example, Cu, Al, Ag, Mo, Cr, Nd, Ni, Mn, Ti, Ta and W, etc., or an alloy thereof. The gate metal layer may have a single-layer structure or a multi-layer structure, wherein the multi-layer structure may be, for example, Cu\Mo, Ti\Cu\Ti and Mo\Al\Mo, etc. A layer of photoresist is coated on the gate metal layer, and the photoresist is exposed and developed via a mask plate to form a photoresist removed region and a photoresist reserved region, wherein the photoresist reserved region corresponds to the region in which the gate line and the gate electrode 1 exist, and the photoresist removed region corresponds to other regions. The gate metal film in the photoresist removed region is completely etched off via an etching process, and the remaining photoresist is peel off to form a gate line and a gate electrode 1.

Step b: forming a gate insulating layer 102 on the base substrate 100 on which Step a is performed, as shown in FIG. 5.

Specifically, a gate insulating layer 102 with a thickness of about 2000-6000 Å may be deposited on the base substrate 100, on which Step a is performed, via plasma-enhanced chemical vapor deposition (PECVD). The material of the gate insulating layer may be an oxide, a nitride or an oxynitride, the gate insulating layer 102 may have a single-layer structure, a double-layer structure or a multi-layer structure, and the material of the gate insulating layer 102 may be $SiN_x$, $SiO_x$, or $Si(ON)_x$.

Figure 6:
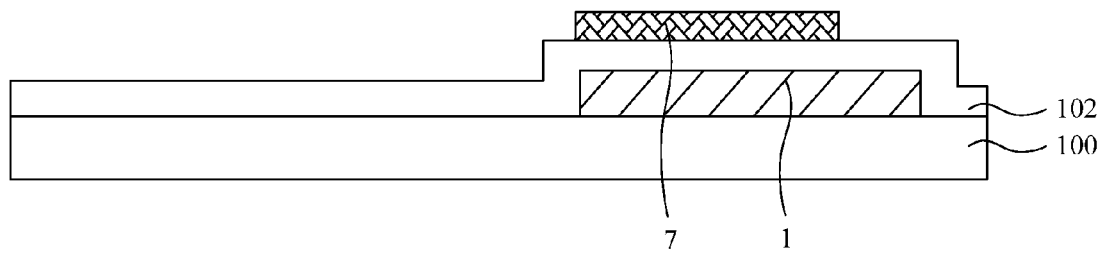

Step c: forming an active layer pattern 7 on the base substrate 100 on which Step b is performed, as shown in FIG. 6.

Specifically, an active layer with a thickness of about 300-1500 Å may be deposited on the base substrate 100, on which Step b is performed, via magnetically-controlled sputtering, heat evaporation or other film-forming methods, wherein the material of the active layer may be a silicon semiconductor or a metal oxide semiconductor. Then, a patterning process is performed on the active layer to form an active layer pattern 7.

Figure 7:
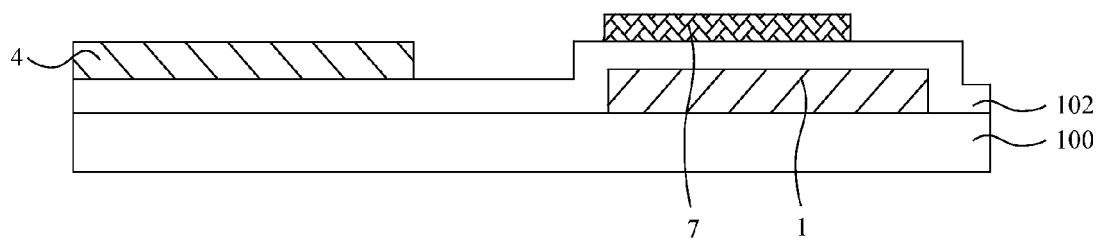

Step d: forming a pixel electrode 4 on the base substrate 100 on which Step c is performed, as shown in FIG. 7.

Specifically, a transparent conductive layer with a thickness of 300-1500 Å is deposited on the base substrate 100, on which Step c is performed, via magnetically-controlled sputtering, heat evaporation or other film-forming methods. The material of the transparent conductive layer may be ITO or IZO. A layer of photoresist is coated on the transparent conductive layer; the photoresist is exposed and developed via a mask plate to form a photoresist removed region and a photoresist reserved region. The photoresist reserved region corresponds to the region in which the pixel electrode 4 exists, and the photoresist removed region corresponds to other regions; the transparent conductive layer in the photoresist removed region is completely etched off via an etching process, and the remaining photoresist is peel off to form a pixel electrode 4.

Figure 8:
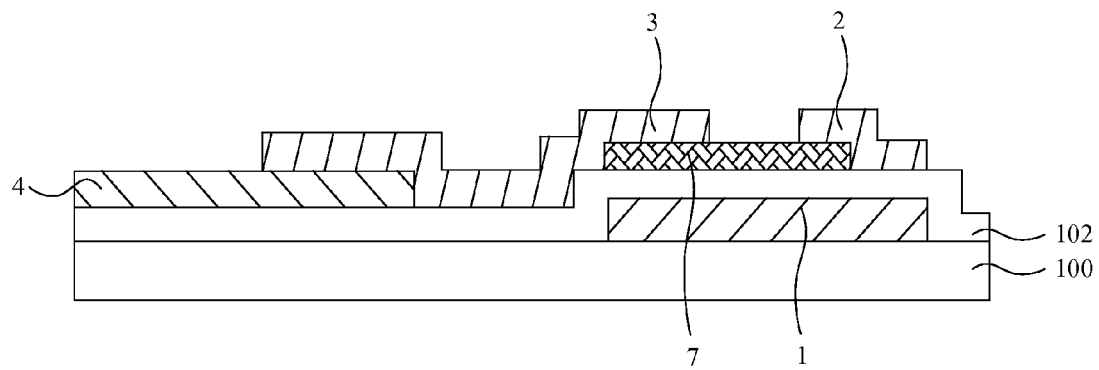

Step e: forming the patterns of a data line, a source electrode 2 and a drain electrode 3 on the base substrate 100, on which Step d is performed, via a one-time patterning process, as shown in FIG. 8.

Specifically, a source-drain metal layer with a thickness of about 2000-6000 Å may be deposited on the base substrate 100, on which Step d is performed, via magnetically-controlled sputtering, heat evaporation or other film-forming methods. The material of the source-drain metal layer may be a metal such as Cu, Al, Ag, Mo, Cr, Nd, Ni, Mn, Ti, Ta and W, etc., or an alloy thereof. The source-drain metal layer may have a single-layer structure or a multi-layer structure, wherein the multi-layer structure may be, for example, Cu\Mo, Ti\Cu\Ti and Mo\Al\Mo, etc.

A layer of photoresist is coated on the source-drain metal layer, and the photoresist is exposed via a mask plate and developed to form a photoresist removed region and a photoresist reserved region, wherein the photoresist reserved region corresponds to the region in which the data line, the source electrode 2 and the drain electrode 3 exist, and the photoresist removed region corresponds to other regions. The source-drain metal film in the photoresist removed region is completely etched off via an etching process, and the remaining photoresist is peeled off to form a data line, a source electrode 2 and a drain electrode 3, as shown in FIG. 8.

The source electrode 2 and the data line are electrically connected with each other, and the drain electrode 3 is provided on the pixel electrode 4 and directly laps on the pixel electrode 4 and thus is electrically connected therewith.

Figure 9:
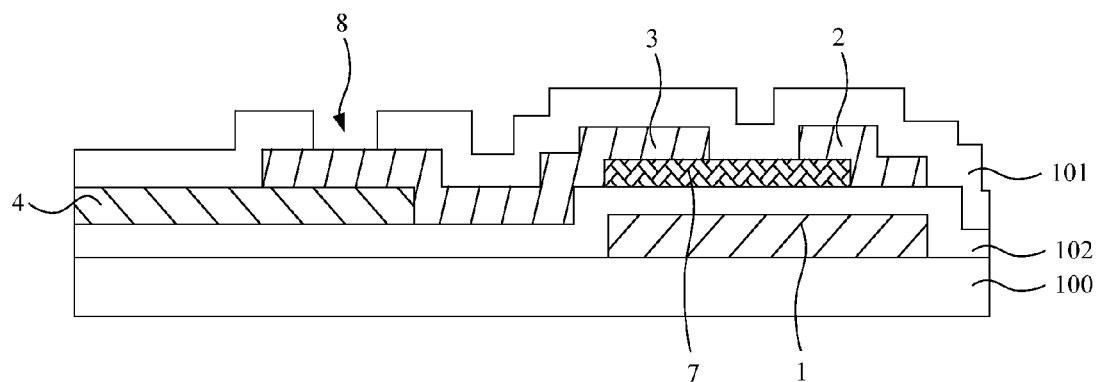
-FIG. 9 is a schematic flow chart showing a manufacturing process of an array substrate according to one embodiment of the invention.

Step f: forming a passivation layer 101 including a passivation layer via hole 8 on the base substrate 100, on which Step e is performed, via a one-time patterning process, and exposing a drain electrode 3, as shown in FIG. 9.

Specifically, a passivation layer 101 with a thickness of 400-5000 Å is deposited on the base substrate 100, on which Step e is performed, via magnetically-controlled sputtering, heat evaporation, PECVD or other film-forming methods. The material of the passivation layer 101 may be an oxide, a nitride or a oxynitride. For example, the material of the passivation layer 101 may be $SiN_x$, $SiO_x$, or $Si(ON)_x$. The passivation layer 101 may have a single-layer structure, or it may have a double-layer structure consisted of silicon nitride and silicon oxide.

A layer of photoresist is coated on the passivation layer 101; and the photoresist is exposed via a mask plate and developed to form a photoresist removed region and a photoresist reserved region. The photoresist removed region corresponds to the region in which the passivation layer via hole 8 exists, and the photoresist reserved region corresponds to other regions. The passivation layer in the photoresist removed region is completely etched off via an etching process to form a passivation layer via hole 8 and expose the drain electrode 3. The remaining photoresist is peeled off.

Step g: forming the patterns of a common electrode 5 and an electrical connection block 6 on the base substrate 100, on which Step f is performed, via a one-time patterning process, as shown in FIG. 3. The common electrode 5 is a slit electrode, and the electrical connection block 6 fills the passivation layer via hole 8, and one end thereof contacts the drain electrode 3 via the passivation layer via hole 8, and the other end covers the surface of the passivation layer 101 and is exposed to the surface of the array substrate, as shown in FIG. 9.

Specifically, a transparent conductive layer with a thickness of 300-1500 Å is deposited on the base substrate 100, on which Step f is performed, via magnetically-controlled sputtering, heat evaporation or other film-forming methods, and the material of the transparent conductive layer may be ITO or IZO. A layer of photoresist is coated on the transparent conductive layer, the photoresist is exposed via a mask plate and developed to form a photoresist removed region and a photoresist reserved region. The photoresist reserved region corresponds to the region in which the common electrode 5 and the electrical connection block 6 exist, and the photoresist removed region corresponds to other regions. The transparent conductive layer in the photoresist removed region is completely etched off via an etching process, and the remaining photoresist is peeled off to form a common electrode 5 and an electrical connection block 6, wherein the electrical connection block 6 fills the passivation layer via hole 8, and one end thereof contacts the drain electrode 3, and the other end covers the surface of the passivation layer 101 and is exposed to the surface of the array substrate, as shown in FIG. 3 and FIG. 9.

Thus far, the manufacturing of an array substrate is completed.

According to further embodiment of the invention, the invention further provides a display device, which includes the above array substrate. The array substrate includes a common electrode and an electrical connection block, wherein, the common electrode is located on a pixel electrode, that is, the common electrode is located on the uppermost layer of the array substrate. One end of the electrical connection block contacts the pixel electrode or the drain electrode of the thin-film transistor via a passivation layer via hole, and the other end is exposed to the surface of the array substrate. Therefore, the electrical connection with the pixel electrode or the drain electrode of the thin-film transistor can be realized by the contact between the Pixel probe of a measuring apparatus and the electrical connection block, and the measuring of the electrical characteristics of the thin-film transistor may be realized, thereby the display quality of the product may be guaranteed.

According to further embodiment of the invention, the invention provides a method for measuring the electrical characteristics of the array substrate as shown in FIG. 1 which includes:

contacting a gate line probe with a gate line 10 of an array substrate;

contacting a data probe with a data line 20 of the array substrate; and contacting a pixel probe with an electrical connection block 6, loading a preset voltage to the gate line probe and the data line probe, and obtaining the electrical characteristic value of the thin-film transistor via a signal output by the pixel probe.

The above description only shows some preferred implementation modes of the invention. It should be noted that, various improvements and substitutions may also be made by one of ordinary skills in the art without departing from the technical principles of the invention, and all these improvements and substitutions should be construed as pertaining to the protection scope of the invention.

What is claimed is:

1. An array substrate comprising a plurality of pixel units, wherein each pixel unit comprises a thin-film transistor, a pixel electrode and a common electrode, a passivation layer covers on the pixel electrode and the thin-film transistor, the common electrode is located on the passivation layer and corresponds to the location of the pixel electrode, and a drain electrode of the thin-film transistor is electrically connected with the pixel electrode, and wherein a passivation layer via hole is formed in the passivation layer;

each pixel unit further comprises an electrical connection block that fills the passivation layer via hole;

the drain electrode of the thin-film transistor is provided on the pixel electrode and directly lapped on the pixel electrode, and one end of the electrical connection block is provided in contact with the drain electrode of the thin-film transistor via the passivation layer via hole, and the other end is exposed to the surface of the array substrate.

2. The array substrate according to claim 1, wherein, the electrical connection block and the common electrode are formed of the same transparent conductive layer at the same time via a one-time patterning process, and the common electrode is provided on the uppermost layer of the array substrate.

3. The array substrate according to claim 2, wherein, the electrical connection block penetrates through the passivation layer via hole, and the contact area between one end of the electrical connection block and the pixel electrode or the drain electrode is smaller than the sectional area of the other end that is exposed to the surface of the array substrate, and the other end that is exposed to the surface of the array substrate covers the surface of the passivation layer.

4. A method for measuring the electrical characteristics of the array substrate according to claim 1, comprising:
- contacting a gate line probe with the gate line of the array substrate; and
- contacting a data probe with the data line of the array substrate; and contacting a pixel probe with the electrical connection block, loading a preset voltage to the gate line probe and the data line probe, and obtaining the electrical characteristic value of the thin-film transistor via a signal output by the pixel probe.

5. A method for manufacturing an array substrate, comprising forming a plurality of pixel units, wherein the step of forming each pixel unit comprises:
- forming patterns of a thin-film transistor and a pixel electrode;
- forming a passivation layer on the pixel electrode and the thin-film transistor;
- forming a pattern of a common electrode on the passivation layer, wherein the common electrode corresponds to the location of the pixel electrode, and a drain electrode of the thin-film transistor is electrically connected with the pixel electrode;
- performing a pattering process on the passivation layer to form a passivation layer via hole; and
- forming an electrical connection block that fills the passivation layer via hole, wherein the drain electrode of the thin-film transistor is provided on the pixel electrode and directly lapped on the pixel electrode, and one end of the electrical connection block is provided in contact with the drain electrode of the thin-film transistor via the passivation layer via hole, and the other end is exposed to the surface of the array substrate.

6. The method according to claim 5, wherein, the step of forming the common electrode and the electrical connection block comprises:
- forming a transparent conductive layer on the passivation layer; and
- performing a pattering process on the transparent conductive layer to form patterns of the common electrode and the electrical connection block.

7. The method according to claim 6, wherein, the electrical connection block penetrates through the passivation layer via hole, and the contact area between one end of the electrical connection block and the pixel electrode or the drain electrode is smaller than the sectional area of the other end that is exposed to the surface of the array substrate, and the other end that is exposed to the surface of the array substrate covers the surface of the passivation layer.

* * * * *